United States Patent
Shobash (10) Patent No.: US 11,709,604 B1
(45) Date of Patent: Jul. 25, 2023

(54) MEMORY TRAINING USING ELECTRONIC NOISE

(71) Applicant: Amazon Technologies, Inc., Seattle, WA (US)

(72) Inventor: Adam Shobash, Kfar Kama (IL)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/433,629

(22) Filed: Jun. 6, 2019

(51) Int. Cl.
*G11C 11/4076* (2006.01)
*G06F 3/06* (2006.01)

(52) U.S. Cl.
CPC ............ *G06F 3/0632* (2013.01); *G06F 3/0604* (2013.01); *G06F 3/0659* (2013.01); *G06F 3/0673* (2013.01); *G11C 11/4076* (2013.01)

(58) Field of Classification Search
CPC ..... G06F 3/0632; G06F 3/0673; G06F 3/0604; G06F 3/0659; G11C 11/4076
USPC .................................................. 711/104, 101
See application file for complete search history.

(56) References Cited

U.S. PATENT DOCUMENTS

| | | | |
|---|---|---|---|
| 9,665,289 B1* | 5/2017 | Mach et al. | G06F 3/067 |
| 2011/0218949 A1* | 9/2011 | Cho et al. | G06N 20/00 706/12 |
| 2019/0158048 A1* | 5/2019 | Medra et al. | H03F 3/195 |
| 2019/0311267 A1* | 10/2019 | Qin et al. | G06N 3/0445 |
| 2020/0293415 A1* | 9/2020 | Mukherjee et al. | G06F 11/2205 |

\* cited by examiner

*Primary Examiner* — David Yi
*Assistant Examiner* — Zubair Ahmed
(74) *Attorney, Agent, or Firm* — Klarquist Sparkman, LLP (57) ABSTRACT

Technologies are provided for increasing electronic noise of a memory device during an initialization of the memory device and performing initialization operations, such as memory access centering operations, for the memory device while the electronic noise of the memory device is increased. The electronic noise of the memory device can be increased by increasing a level of ground bounce (or ground noise) during a training phase of the memory device. Increasing the ground noise can comprise increasing an inductance across a memory of the memory device during the training phase. The inductance can be increased by deactivating one or more ground connections of the memory during the memory's training phase. Additionally or alternatively, the inductance can be increased by activating one or more inductors connected to one or more ground connections of the memory during the memory's training phase.

19 Claims, 7 Drawing Sheets

MEMORY TRAINING USING ELECTRONIC NOISE

BACKGROUND

Some computer-accessible memories, such as double data rate (DDR) 4 memories, undergo an initialization process before they can be used to perform read and/or write operations. This initialization process can occur as part of a boot sequence of a computing device to which a computer-accessible memory is connected. Example initialization operations include memory read centering and memory write centering. The purpose of the read and write centering operations is to determine values (such as a read data strobe (DQS) delay or a write DQS delay) that are then used to read/write a value from/to the memory after the memory has been initialized.

DETAILED DESCRIPTION

Memory initialization operations can include the identification of a read delay (such as a read data strobe (DQS) delay) for use in reading data from the memory, identification of a write delay for use in writing data to the memory, and/or the identification of reference voltage(s) (vrefs) for use in reading and/or writing data from/to the memory. Identifying these value(s) can be referred to as read/write training or read/write centering. The process can be referred to as read/write centering because the process can involve testing a range of delay and/or vref values while accessing the memory, identifying a sub-range of the tested range that yielded a valid result, and then selecting a delay value (and/or vref value) near a center of this sub-range for use in subsequent memory access operations.

However, these memory initialization operations can sometimes produce sub-optimal results because the level of electronic noise affecting the memory during the initialization is not the same as the level of electronic noise affecting the memory during normal operation.

The electronic noise experienced during the initialization (or training) of the memory can be lower than the electronic noise experienced during a functional (or operational) mode of the memory. This can occur, for instance, because the algorithm(s) used to train the memory do not accurately reflect actual usage patterns of the memory when it is operational. In many cases, the patterns of read and/or write operations used during the training of the memory are simplistic, whereas actual usage patterns of the memory during operation can be more complex and, thus, result in higher electronic noise across the memory than that experienced during training. Additionally or alternatively, there can be differences between the duration of the training compared to a duration of operations in a normal operation mode of the memory. For example, since the training normally takes place during a boot process, it often must complete in a relatively short period of time. Additionally or alternatively, during the training it is possible that less than all of the cores of a central processing unit and/or memory controller are involved in the training. Thus, the current consumption during the training can be less than the current consumption during the normal operation mode where all of the cores are available for work.

Figure 2A:
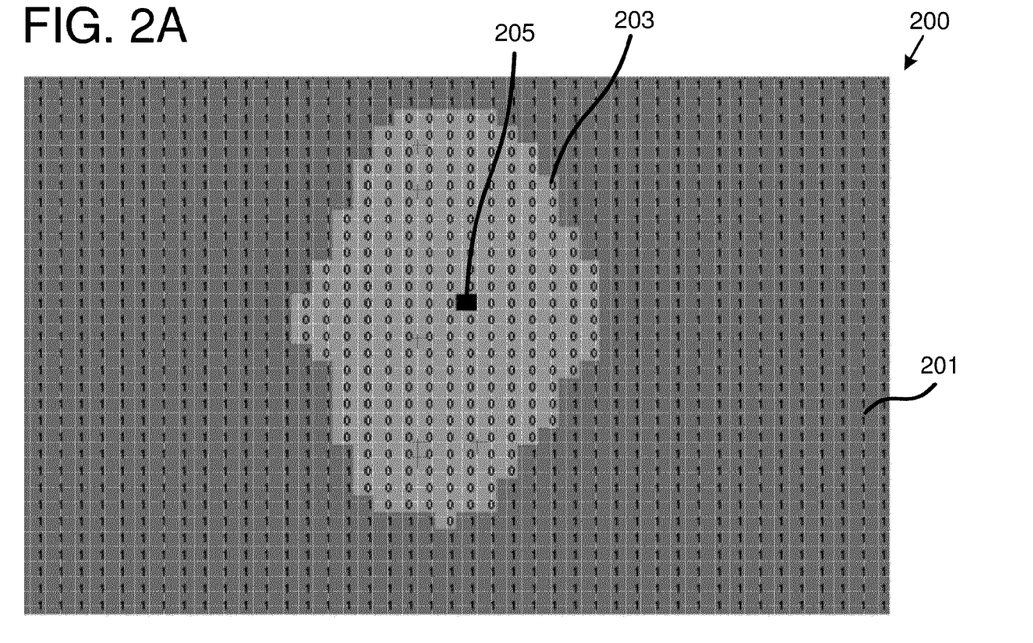
FIG. 2A is a diagram depicting a graph of an example read eye detected during a training phase of a double data rate 4 (DDR4) random-access memory (RAM).
Figure 2B:
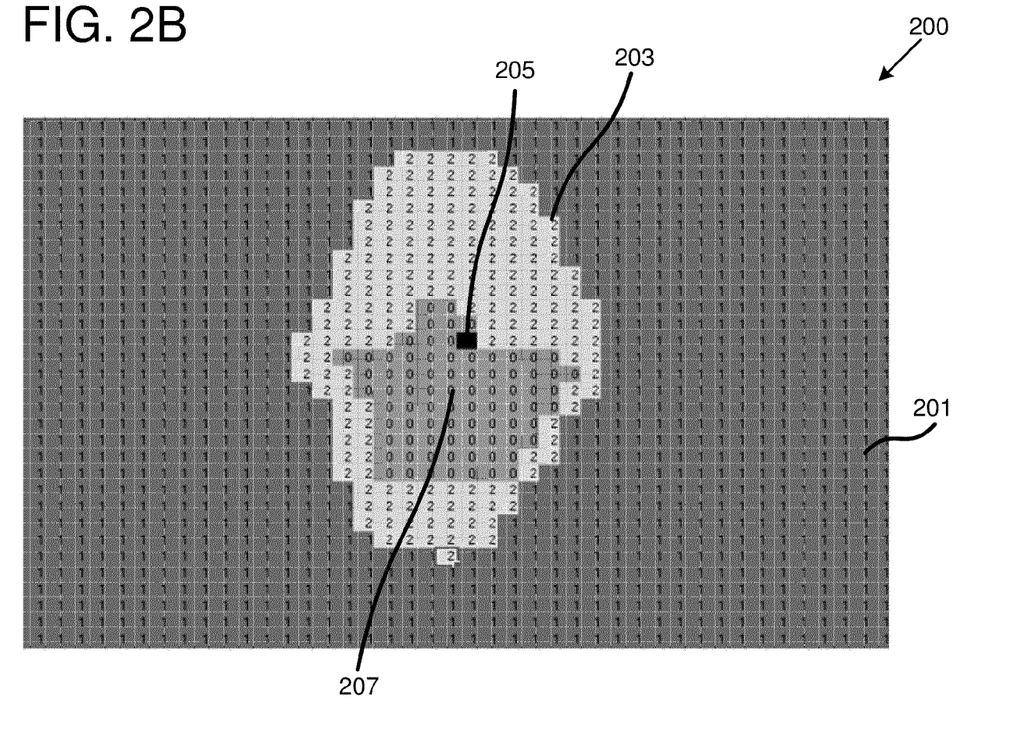
FIG. 2B is a diagram depicting the graph of the example training read eye with an example read eye detected during an operational phase of the DDR4 RAM overlaid on top of the example training read eye.

An example of this is illustrated in FIGS. 2A-B. FIG. 2A is a diagram depicting a graph 200 of an example read eye detected during a training phase of a double data rate (DDR) 4 random-access memory (RAM). Each row in the graph 200 is associated with a different reference voltage (vref). Each column in the graph 200 is associated with a different DQS delay value. A delay in this example refers to a read delay, however, a similar process can be performed using write delays. A read delay can be regarded as a delay between a point in time when a memory controller requests a value from the memory, and when the memory controller samples the value from the memory (e.g., a DQS delay for a DDR4 memory). Thus, each cell (e.g., 201, 203, and 205) in the graph 200 is associated with a vref, delay pair. The value of a cell in the graph 200 indicates whether or not a correct value was read from the memory using the vref and delay associated with the cell. A value of "0" indicates that the correct value was read from the memory, and a value of "1" indicates that an incorrect value was read from the memory. For example, the vref and delay combination associated with cell 203 resulted in a correct value being read from the memory, whereas the vref and delay combination associated with the cell 201 resulted in an incorrect value being read from the memory.

The set of cells in the graph 200 that are associated with vref, delay combinations which resulted in correct read results can be referred to as an "eye" (so called because the range of "good" delay values for a given vref usually falls in the center of the range of possible delay values and, thus, normally results in a formation that roughly resembles an eye). Since the graph 200 is for a read training, the eye can be referred to as a "read eye." Similar steps can be taken to perform a write training, in which case the eye can be referred to as a "write eye."

In many cases, once the eye has been detected, a cell located close to the center of the eye is selected as the center of the eye. In the example read calibration depicted in FIG. 2A, the cell 205 is selected as the center of the read eye. The vref and delay values associated with the center of the eye are then used to access the memory in its operational mode. In this example, the vref and delay values associated with the cell 205 are selected for use for read access during the normal operation of the memory. This process can be referred to as "read centering" or "read access centering."

Similar operations can be performed to calibrate write access to the memory. In that case, a center is identified in a write eye for the memory and the associated vref and delay are subsequently used to perform write access operations during the memory's operational mode. This process can be referred to as "write centering" or "write access centering." Read access centering and write access centering can be referred to more generally as memory access centering.

As illustrated in FIG. 2B, the eye detected during the training phase is not necessarily the same as the eye that exists for the memory during its operational phase.

FIG. 2B is a diagram depicting the graph 200 with an example read eye detected during an operational phase of the DDR4 RAM overlaid on top of the example read eye detected during the training. Cells of the graph 200 that were in the training read eye, and that are also in the operational read eye are displayed with values of "0" (e.g., 207 and 205). Cells of the graph 200 that were in the training read eye, but are not in the operational read eye are displayed with values of "2" (e.g., 203). As can be seen, several of the cells that were identified as falling within the read eye during training actually fall outside the read eye when the memory is in its operational mode. Although the cell 205, which was identified as the center of the read eye during training, is still within the operational read eye in this example, it is located at the edge of the eye and is not a central location for the operational read eye. A more accurate selection for a center of the read eye that exists during normal operation would be cell 207. Thus, a center of an eye selected during training may not represent an actual center of the eye during the memory's normal operation. The selected vref and delay values may, therefore, produce sub-optimal results.

At least some of the techniques described herein can be used to address these issues by increasing electronic noise of a memory device during an initialization of the memory device and performing initialization operations, such as memory access centering operations, for the memory device while the electronic noise of the memory device is increased. The electronic noise of the memory device can be increased by increasing a level of ground bounce (or ground noise) during a training phase of the memory device. Increasing the ground noise can comprise increasing an inductance across a memory of the memory device during the training phase. For example, the inductance can be increased by deactivating one or more ground connections of the memory and/or activating one or more inductors connected to one or more ground connections of the memory, during the training phase.

The size and shape of a read/write eye in the training and the read/write eye in the operational phases of the memory can differ because the usage patterns (and/or current consumption) of the memory during normal operation differ from the usage patterns (and/or current consumption) during training. For example, during normal operation the memory (and other memories on a same memory module as the memory) may encounter much higher levels of access than those encountered during the training. This increase in access levels can lead to higher levels of electronic noise across the memory during normal operation. These higher levels of electronic noise can change the shape and location of the memory access eye(s) (the read access eye and/or the write access eye).

Memory access centering operations, such as the example read centering operation depicted in the graph 200 in FIG. 2A, can be optimized by creating conditions that will cause the training eye to more closely resemble the eye when the memory is in an operational mode. This can be done by increasing the electronic noise across the memory during training.

The electronic noise can be increased during the training of the memory to an amount approximate to or equal to a noise across the memory during normal operation. This is expressed in equation 1 below:

$$V_{training} = V_{functional} \quad (1)$$

where $V_{training}$ is an electronic noise (such as a ground/power bounce) across the memory during training, and $V_{functional}$ is an electronic noise across the memory during its functional (or operational) mode. The electronic noise can be modeled as a function of inductance and the derivative of current with respect to time. Thus, equation 1 can be expanded as expressed in equation 2 below:

$$L_{training} * \frac{dI_{training}}{dt} = L_{functional} * \frac{dI_{functional}}{dt} \quad (2)$$

where $L_{training}$ is an inductance of the memory during training, $$\frac{dI_{training}}{dt}$$

is a derivative of a current consumed when signals are switched during training ($dI_{training}$) with respect to time, $L_{functional}$ is an inductance of the memory during the functional mode, and $$\frac{dI_{functional}}{dt}$$

is a derivative of a current consumed when signals are switched during normal operation ($dI_{functional}$) with respect to time. Thus, the electronic noise during training ($V_{training}$) can be increased by increasing a change in current over time $$\left(\frac{dI_{training}}{dt}\right)$$

during training and/or increasing the inductance ($L_{training}$) during training.

The change in current during training can be increased, for example, by using algorithms and/or data patterns during the training of the memory that more closely resemble usage patterns of the memory during normal operation. However, in at least some cases, it may difficult to develop algorithms and/or data patterns that accurately model normal operational usage patterns. Furthermore, the training data patterns are usually designed to be simplistic because the training normally occurs during a boot sequence and, thus, needs to execute quickly. If more complex data patterns were used, the additional time taken by the training may lead to unacceptable increases in boot time.

Additionally or alternatively, the inductance across the memory can be increased to increase the electronic noise during training. In at least some scenarios, increasing inductance during training to an amount expressed in equation 3 below can result in electronic noise during training that is approximately equal to the electronic noise during the operational mode of the memory:

$$L_{training} = L_{functional} \frac{I_{functional}}{I_{training}} \qquad (3)$$

In any of the examples described herein, a memory can comprise an electronic device configured to store one or more values (such as a device configured to store one or more values using one or more switches, transistors, etc.). Example types of memories include volatile memories (e.g., memories that require an active connection to a power source to retain values) and non-volatile memories (e.g., memories that can retain values without an active connection to a power source).

Example memories include random access memory (RAM). Example classes of RAMs include dynamic random access memories (DRAMs) (e.g., synchronous dynamic random access memory (SDRAM)) and static random-access memories (SRAMs). Example SDRAMs include double data rate (DDR) memory (a.k.a., DDR SDRAM). Example types of DDR memory include DDR, DDR2, DDR3, DDR4, DDR5, and the like. Some examples described herein involve memory initialization steps that are particular to DDR4 memory. However, this is not intended to be limiting. The technologies described herein can be applied to other types of memories as well.

In at least some embodiments, a memory can be a part of a semiconductor memory device that comprises a plurality of memories. For example, a plurality of memories can be connected to a circuit board (such as a printed circuit board (PCB)) that comprises connections by which the plurality of memories can be accessed. Example semiconductor memory devices include memory modules. A memory module can comprise a plurality of memory chips, wherein a memory chip comprises a plurality of memory cells that each can store a separate value. Example memory modules include dual-inline memory modules (DIMMs) and single in-line memory modules (SIMMs). In such a configuration, the term "memory" can refer to a single memory cell of a memory chip. In at least some embodiments where a memory module comprises a plurality of memory chips connected to a PCB, separate control lines can be provided for the separate memory chips to increase electronic noise across the separate memory chips.

As the term is used herein, a memory controller can comprise a hardware device (such as processor, an application-specific integrated circuit (ASIC), a field-programmable gate array (FPGA), a system on a chip (SOC), or the like) that is connected to a memory and configured to manage access to the memory by a processor to which the memory controller is connected. A memory controller can be configured to perform various operations to initialize a memory for use. Example initialization operations include memory training operations. Example initialization operations that can be performed for a DDR4 memory by a memory controller include ZQ calibration, vref DQ calibration, and read/write training. Example read/write training operations include read access training (e.g., read access centering) and write access training (e.g., write access centering). In at least some embodiments, a memory controller can be connected to a memory device (such as a memory module). In such an embodiment, the memory controller can be configured to perform initialization operations for a plurality of memory cells of the memory device.

Figure 1:
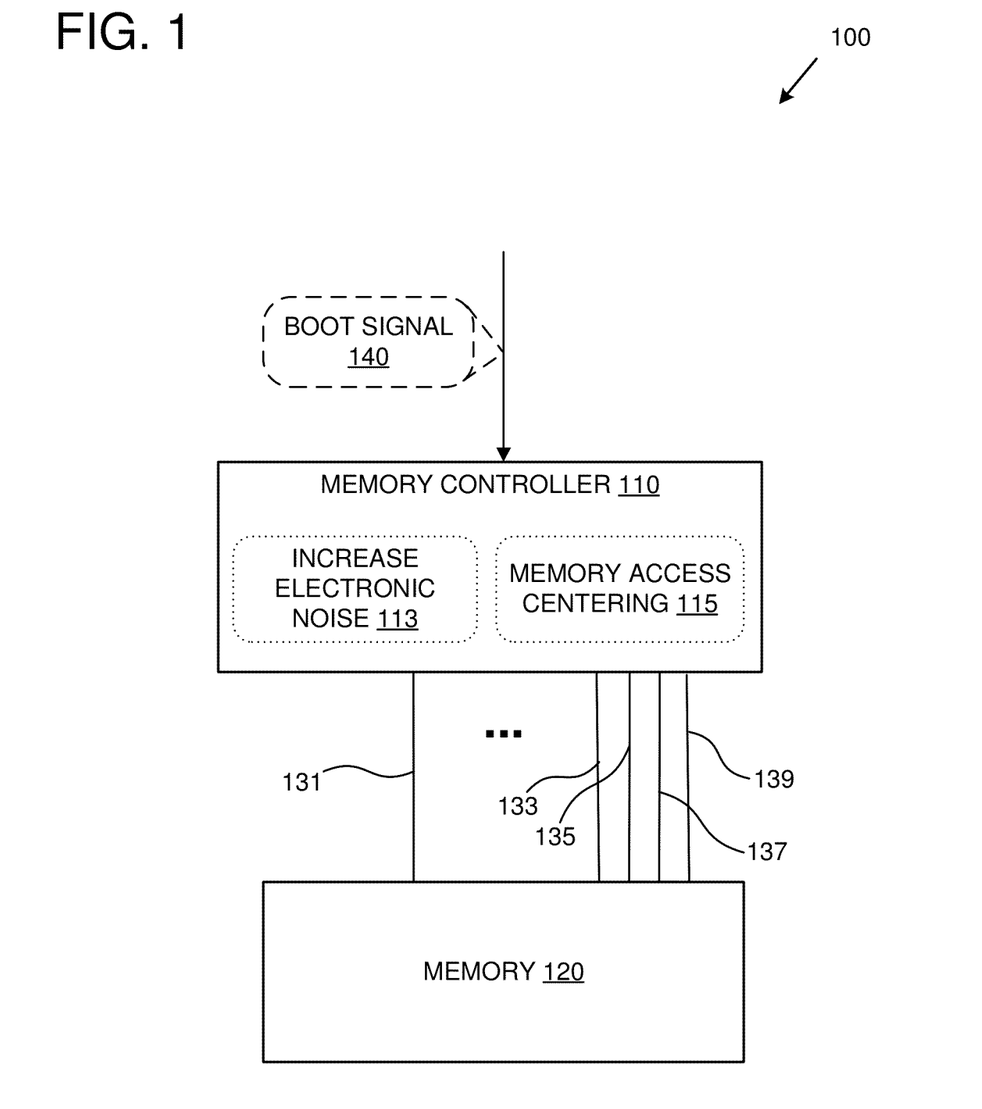
FIG. 1 is a system diagram depicting an example system for memory training using electronic noise.

FIG. 1 is a system diagram depicting an example system 100 for optimizing memory training using electronic noise. The example system 100 comprises a memory controller 110 and a computer-accessible memory 120 that is connected to the memory controller 110 via one or more connections (e.g. 131-139). Although five connections (131-139) between the memory controller 110 and the memory 120 are depicted in FIG. 1, this is for illustration purposes and is not intended to be limiting. More or fewer connections between the memory controller 110 and the memory 120 are possible.

The connections between the memory controller 110 and the memory 120 can comprise a plurality of pins, vias, lines, etc. For example, the connections can comprise electronic communication lines printed on a printed circuit board (PCB) to which the memory controller 110 is attached via one or more pins. Alternatively, the memory controller 110 can be connected to the memory 120 via a ball grid array comprising a plurality of solder balls. Other types of connections are also possible.

The memory controller 110 is configured to increase electronic noise 113 (such as electronic ground noise) of the computer-accessible memory 120 during the training phase of the computer-accessible memory 120. The memory controller 110 can be configured to place the computer-accessible memory 120 into the training phase as part of an initialization of the computer-accessible memory 120. Optionally, the memory controller 110 can place the computer-accessible memory 120 into the training phase upon receipt of a boot signal 140. Such a boot signal can be received by the memory controller 110 during a boot sequence of a computing device to which the memory controller 110 is attached.

Configuring the memory controller 110 can comprise programming a firmware (not shown) of the memory controller 110. Such a firmware can be stored in a storage (such as a read-only memory (ROM)) that is accessible by the memory controller 110.

In at least some embodiments, the increase of electronic noise 113 can comprise increasing an electronic ground noise (or ground bounce) of the computer-accessible memory 120 during the training phase. Increasing the electronic ground noise of the computer-accessible memory 120 can comprise increasing an inductance of the computer-accessible memory 120. For example, the electronic ground noise of the computer-accessible memory 120 can be increased by increasing an inductance between a ground of the memory controller 110 and a ground on a board (such as a PCB or the like) to which the memory 120 is attached.

The inductance between the ground of the memory controller 110 and the ground on the board to which the memory 120 is attached can be increased, for example, by adding inductance to a power supply chain on the board. For example, increasing the inductance of the computer-accessible memory 120 can comprise deactivating one or more ground connections between the memory controller 110 and the computer-accessible memory 120. For example, the memory controller 110 can deactivate one or more ground connections (e.g., 131) connecting the memory controller 110 to the computer-accessible memory 120. By deactivating (or disconnecting) some, but not all, of the ground connections between the memory controller 110 and the computer-accessible memory 120, the overall inductance between the ground of the memory controller 110 and a ground on a board to which the memory 120 is attached can be increased. This increase in inductance can result in higher levels of electronic ground noise across the memory 120.

Additionally or alternatively, increasing the inductance of the computer-accessible memory 120 can comprise activating an inductor connected to one or more ground connections of the computer-accessible memory 120. For example, the memory controller 110 can transmit a signal (or signals) via one or more connections (e.g., 131) to activate an inductor connected to one or more ground connections of a board to which the computer-accessible memory 120 is attached. By activating an inductor connected to one or more ground connections of the computer-accessible memory 120, the overall inductance between the ground of the memory controller 110 and a ground on a board to which the memory 120 is connected can be increased. This increase in inductance can result in higher levels of ground noise across the memory 120.

The memory controller 110 is further configured to perform one or more memory access centering operations 115 for the computer-accessible memory 120 while the electronic noise of the memory 120 is increased. Example memory access centering operations include read access centering operations and write access centering operations. Performing the memory access centering operation can comprise transmitting and/or receiving the plurality of signals to and/or from the memory 120 to identify a center of an access eye (such as a read eye or write eye) for the computer-accessible memory 120. For example, the connections 133, 135, 137, and 139 (which can represent a data line, a command line, an address line, and a clock line, respectively) can be used to perform the memory access centering operation while the memory controller 110 simultaneously increases the electronic noise across the memory 120 using one or more other connections (e.g., 131).

After the one or more memory access centering operations 115 is/are completed, parameters associated with the memory eye centers (such as a read delay, a read reference voltage, a write delay, and/or a write reference voltage) can be stored by the memory controller 110 and used to perform subsequent memory access operations during an operational mode of the memory 120.

Optionally, the memory controller 110 can be configured to increase the electronic noise 113 and perform the memory access centering 115 responsive to receipt of a boot signal 140. For example, the increasing the electronic noise 113 and memory access centering 115 can be performed as part of a boot sequence of a computing device to which the memory controller 110 is connected.

Figure 3:
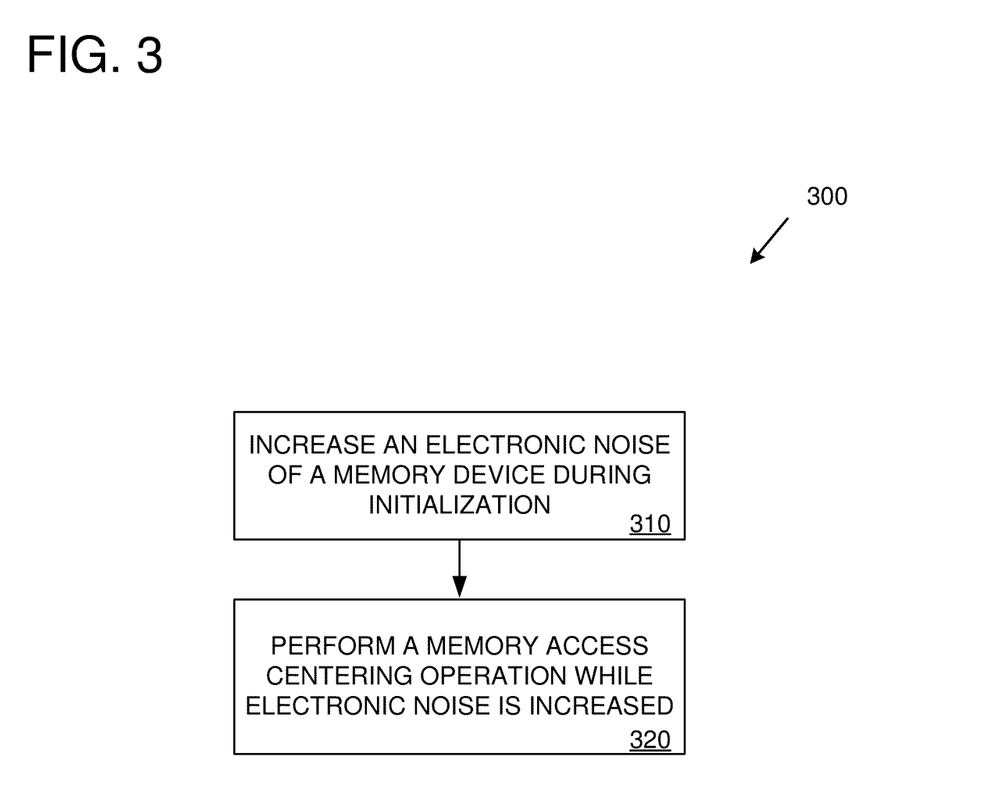
FIG. 3 is a flowchart of an example method for optimizing memory training using electronic noise.

FIG. 3 is a flowchart of an example method 300 for optimizing memory training using electronic noise. Any of the example systems described herein can be used to perform the example method 300. For example, the system 100 depicted in FIG. 1, and described above, can be used to perform the example method 300. For example, the system 400 depicted in FIG. 4 can be used to perform the example method 300. For example, the system 500 depicted in FIG. 5 can be used to perform the example method 300. For example, the system 600 depicted in FIG. 6 can be used to perform the example method 300.

At 310, an electronic noise of a memory device is increased during an initialization of the memory device. The electronic noise of the memory device can be increased by a memory controller connected to a memory of the memory device. For example, the example system 400, depicted in FIG. 4, comprises a memory controller 420 and a memory 430. The memory controller 420 is configured to increase electronic noise 440 during a training phase of the memory 430. In at least some embodiments, the memory controller 420 is connected to the memory 430 via a plurality of connections and one or more of these connections is/are used to increase the electronic noise 440.

Figure 4:
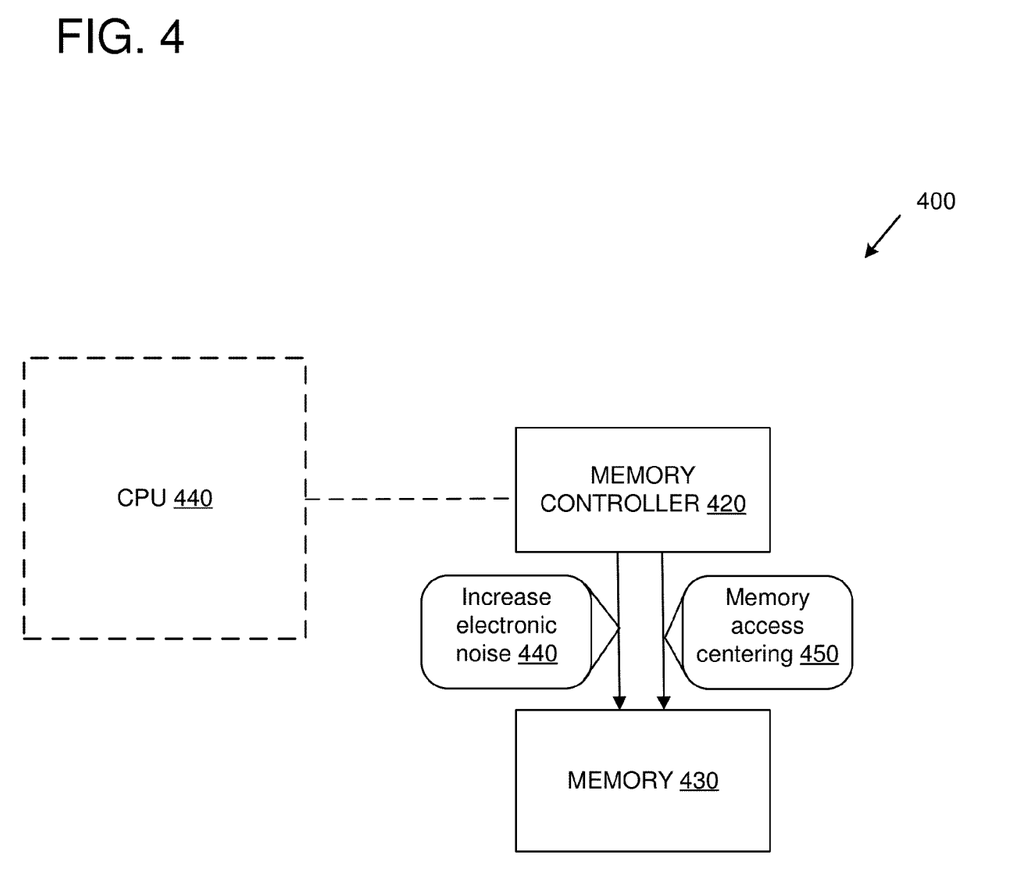
FIG. 4 is a system diagram depicting an example system comprising a memory controller configured to train a memory using electronic noise.

The memory controller 420 can comprise a processor, an ASIC, an FPGA, an SOC, or the like, that is connected to externally accessible connectors of the memory 430. In such an embodiment, the memory 430 can be part of a separate memory module (such as a SIMM, DIMM, etc.). Although FIG. 4 depicts the memory controller 420 and the memory 430 as separate components, these components can, in at least some embodiments, be part of a single memory device.

The training phase can be a phase which occurs during an initialization of the memory 430. For example, the memory controller 420 can be connected to a processor (e.g., CPU 440). During a boot sequence of a computing device to which the processor is attached, the processor can send a signal to the memory controller 420. The memory controller 420 can be configured to perform an initialization, including the training phase, in response to receiving the boot signal. For example, the memory controller 420 can be configured to perform a plurality of initialization operations during the training phase before placing the memory 430 into an operational phase. The memory controller 420 is configured to increase electronic noise 440 across the memory 430 while one or more of the initialization operations is/are performed during the training phase.

Increasing the electronic noise of a memory device can comprise increasing an inductance of the memory device during the initialization of the memory device. In at least some embodiments, a ground bounce or ground noise of the memory device can be increased by increasing the inductance. For example, the memory controller 420 depicted in FIG. 4 can be configured to increase a ground bounce of the memory 430 during the training phase of the memory.

In at least some embodiments, increasing inductance of the memory device comprises deactivating one or more ground lines of the memory device during the initialization of the memory device. For example, referring to FIG. 4, the memory controller 420 can be configured to increase the ground bounce during the training phase of the memory 430 by deactivating one or more ground lines connected to the memory 430 during the training phase.

Figure 5:
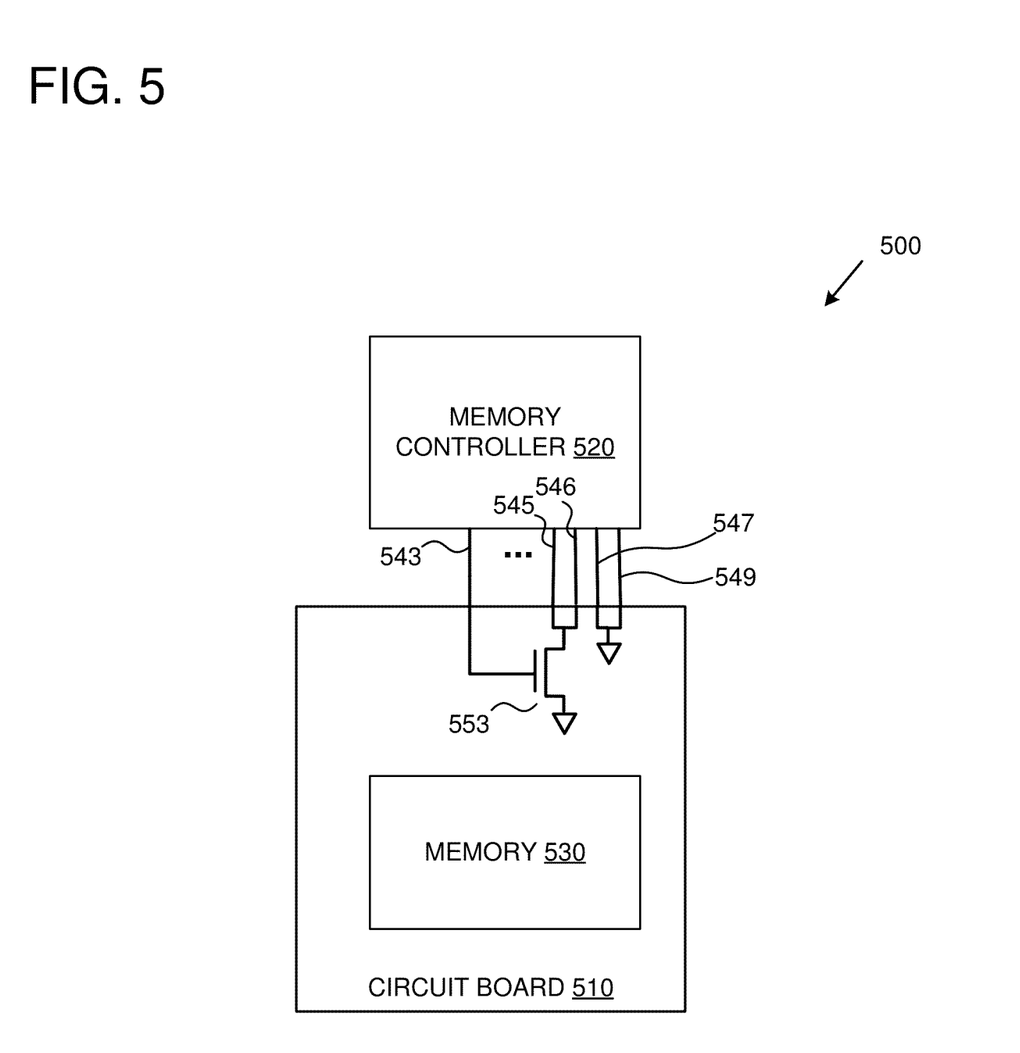
FIG. 5 is a system diagram depicting an example system comprising a memory controller configured to deactivate one or more ground lines connected to a memory.

FIG. 5 is a system diagram depicting an example system 500 comprising a memory controller 520 and a memory 530 connected to a circuit board 510. The memory controller 520 is configured to increase an inductance of the memory 530 by deactivating one or more ground lines connected to the circuit board 510. The circuit board can comprise, for example, a printed circuit board (PCB).

The memory controller 520 is connected to the circuit board 510 by a plurality of connections 543-549. (The number of connections between the memory controller 520 and the circuit board 510 is not intended to be limiting. Other numbers of connections between the controller 520 and the circuit board 510 are possible.) The memory controller 520 can be configured to access the memory 530 using one or more of the connections 543-549. The connections 545-549 comprise ground connections connected to a ground of the memory controller 520 and a ground of the circuit board 510. The ground connections 545-549 can also be referred to as ground lines. Although four ground lines are depicted in FIG. 5, this is for illustration purposes. Other numbers of ground lines are possible.

The circuit board 510 comprises a transistor 553 connected to two of the four ground connections (545 and 546). The memory controller 520 is configured to deactivate the ground lines 545 and 546 by transmitting a signal to the transistor 553 via the connection 543. The memory controller 520 can be configured to deactivate the ground lines 545 and 546 during a training phase of the memory 530. The memory controller 520 can be configured to activate the ground lines 545-546 during an operational phase of the memory 530 by transmitting another signal (such as a No-Op signal) via the connection 543.

Although FIG. 5 depicts two ground lines (545 and 546) connected to the transistor 553, in practice different numbers of ground lines may be deactivated during an initialization of the memory 530 based on a variety of factors (such as an electronic noise level experienced by the memory 530 during normal operation, etc.). In at least some embodiments, the ground lines connected to the memory 530 can be controlled individually and deactivated one by one until a ground bounce of the memory 530 approximates a ground bounce detected during normal operation of the memory 530.

For example, an electronic noise level can be detected during an operational phase of the memory 530. The difference between the electronic noise level detected during the operational phase of the memory 530 and an electronic noise level during a training phase of the memory can be determined. An electronic noise during the training phase of the memory 530 can be increased to be approximately equal to the electronic noise level during the operational phase of the memory 530. Increasing the electronic noise level of the memory 530 during the training phase can comprise deactivating ground connections (e.g., one or more of 545-549) of the memory 530 until the electronic noise level of the memory is approximately equal to the electronic noise level detected during the operational phase of the memory 530.

In at least some embodiments, increasing the electronic noise to be approximately equal to the electronic noise level during the operational phase of the memory 530 can comprise an iterative process. For example, the ground noise can be incrementally increased (e.g., by deactivating one or more ground lines) and compared to the level of ground noise detected during the operational phase. This process can be repeated until the electronic ground noise level is approximately equal to the level of ground noise detected during the operational phase. In at least some embodiments, once the correct value is determined, it can be replicated to other devices with similar configurations.

The memory controller 520 can comprise a processor, an ASIC, an FPGA, an SOC, or the like, that is connected to externally accessible connectors of the memory 530. In such an embodiment, the memory 530 can be part of a separate memory module (such as a SIMM, DIMM, etc.). Although FIG. 5 depicts the memory controller 520 and the memory 530 as separate components, these components can, in at least some embodiments, be part of a single memory device.

Referring to FIG. 3, in addition or as an alternative to deactivating one or more ground lines of the memory device, increasing the electronic noise of the memory device can comprise activating one or more inductors connected to one or more ground lines of the memory device. The memory device can comprise one or more inductors connected between one or more ground connections of a controller of the memory device and one or more ground connections of a memory module of the memory device. For example, referring to FIG. 4, the memory controller 420 can be configured to increase the inductance during the training phase of the memory 430 by deactivating one or more inductors (not shown) connected to one or more ground lines of the memory 430 during the training phase.

Figure 6:
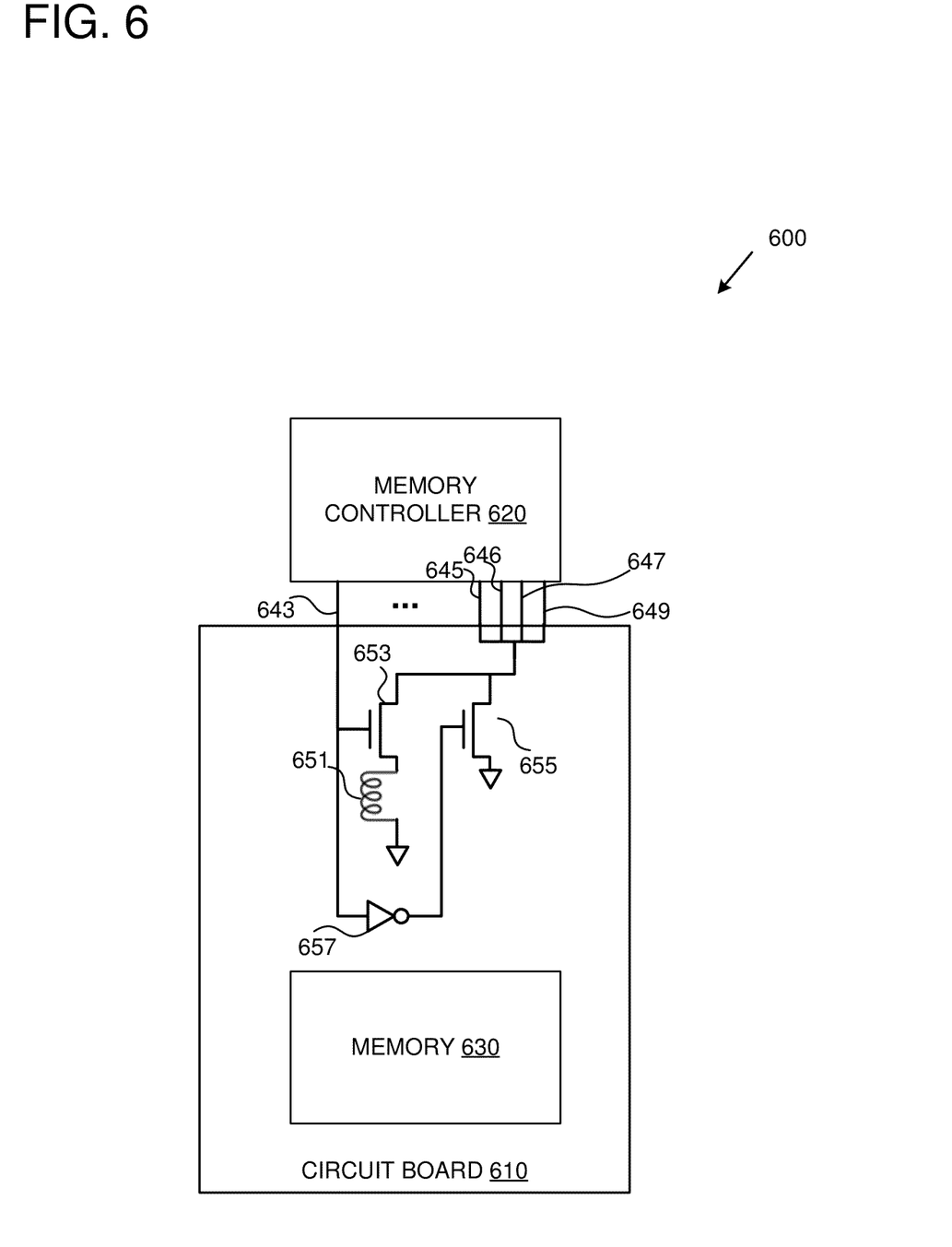
FIG. 6 is a system diagram depicting an example system comprising a memory controller configured to activate one or more inductors connected to a ground line of a memory.

FIG. 6 is a system diagram depicting an example system 600 comprising a memory controller 620 and a memory 630 attached to a circuit board 610. The memory controller 620 is configured to increase an inductance of the memory 630 by activating an inductor 651 connected to one or more ground lines of the circuit board 610. Although a single inductor (651) is depicted in FIG. 6, other numbers of inductors are also possible. It should be understood that the inductor 651 need not be a discrete component or even a component that is designed to operate specifically as an inductor, but could be another component that happens to exhibit a desired level of inductance. The circuit board 610 can comprise, for example, a PCB.

The memory controller 620 is connected to the circuit board 610 by a plurality of connections 643-649. (The number of connections between the memory controller 620 and the circuit board 610 is not intended to be limiting. Other numbers of connections between the controller 620 and the circuit board 610 are possible.) The connections 645-649 comprise ground connections connected to a ground of the memory controller 620 and a ground of the circuit board 610. The ground connections 645-649 can also be referred to as ground lines. Although four ground lines are depicted in FIG. 6, this is for illustration purposes. Other numbers of ground lines are possible.

The circuit board 610 comprises two transistors 653 and 655 connected to the ground lines 645-649. An inductor 651 is connected between the transistor 653 and the ground of the circuit board 610. The memory controller 620 is configured to transmit a signal for the connection 643 to activate the inductor 651. For example, the memory controller 620 can transmit a signal via the connection 643 to activate the transistor 653, thereby closing the connection between the ground lines 645-649 and the inductor 651. The connection 643 is also connected to an inverter 657 that is connected to the transistor 655. Thus, when the memory controller 620 transmits a signal via the connection 643, an inverted signal will be transmitted to the transistor 655. Thus, when the memory controller 620 transmits a signal that will activate the transistor 653, a signal is sent via the inverter 657 that will deactivate the transistor 655. Conversely, when the memory controller 620 transmits a signal that will deactivate the transistor 653, a signal is sent via the inverter 657 that will activate the transistor 655.

The memory controller 620 can be configured to transmit a signal via the connection 643 to activate the inductor 651 during a training phase of the memory 630. The memory controller 620 can be configured to transmit another signal (such as the No-Op signal) via the connection 653 to deactivate the inductor 651, and to activate the transistor 655, during an operational phase of the memory 630. Thus, the inductor 651 connected between the ground lines 645-649 and the ground of the memory 630 can be activated during the training phase of the memory 630 and deactivated during normal operation.

In at least some embodiments, a plurality of inductors can be connected to the ground lines connected to the memory 630. The plurality of inductors can be activated and deactivated individually in order to approximate a ground bounce detected during normal operation of the memory 630.

For example, an electronic noise level can be detected during an operational phase of the memory 630. The difference between the electronic noise level detected during the operational phase of the memory 630 and an electronic noise level during a training phase of the memory 630 can be determined. An electronic noise during the training phase of the memory 630 can be increased to be approximately equal to the electronic noise level during the operational phase of the memory 630. Increasing the electronic noise level of the memory 630 during the training phase can comprise activating the plurality of inductors one at a time until the electronic noise level of the memory 630 is approximately equal to the electronic noise level detected during the operational phase of the memory 630.

In at least some embodiments, increasing the electronic noise to be approximately equal to the electronic noise level during the operational phase of the memory 630 can comprise an iterative process. For example, the ground noise can be incrementally increased (e.g., by activating one or more inductors) and compared to the level of ground noise detected during the operational phase. This process can be repeated until the electronic ground noise level is approximately equal to the level of ground noise detected during the operational phase. In at least some embodiments, once the correct value is determined, it can be replicated to other devices with similar configurations.

The memory controller 620 can comprise a processor, an ASIC, an FPGA, an SOC, or the like, that is connected to externally accessible connectors of the memory 630. In such an embodiment, the memory 630 can be part of a separate memory module (such as a SIMM, DIMM, etc.). Although FIG. 6 depicts the memory controller 620 and the memory 630 as separate components, these components can, in at least some embodiments, be part of a single memory device.

Referring to FIG. 3, at 320, a memory access centering operation is performed for the memory device while the electronic noise of the memory device is increased. Performing the memory access centering operation can comprise identifying a delay value (and/or a reference voltage) that is associated with a point near to a center of an access eye of the memory. For example, the memory access centering operation can comprise a memory read centering operation in which a delay value (and/or reference voltage) that is associated with a point near to a center of a read eye of the memory is identified. Additionally or alternatively, the memory access centering operation can comprise a memory write centering operation in which a delay value (and/or reference voltage) that is associated with a point near to a center of a write eye of the memory is identified. In at least some embodiments, both a read access centering operation and a write access centering operation are performed while the electronic noise is increased. The detected center value(s) can subsequently be used to access a memory of the memory device during an operational phase for the memory device.

For example, referring to FIG. 4, the memory controller 420 is configured to perform a memory access centering operation 450 while maintaining the electronic noise at an increased level. The memory access centering 450 can be performed as part of one or more initialization operations conducted by the memory controller 420 to initialize the memory 430. The memory access centering 450 can comprise identifying a delay (and/or reference voltage) associated with the center of the read eye (and/or a write eye) of the memory 430.

The memory controller 420 can be configured to use the identified center value(s) to access the memory 430 during an operational phase of the memory 430. For example, upon receipt of a memory access signal from the processor 440, the memory controller 420 can be configured to perform an operation to access the memory 430 using the center value(s) identified during the memory access centering operation 450 while the electronic noise was increased 440 during the training phase of the memory 430.

Although a single memory 430 is depicted in FIG. 4, the example system 400 can, in at least some embodiments, comprise a plurality of memories. In such an embodiment, the memory controller 420 can be configured to increase electronic noise across one or more boards to which the plurality of memories are attached. The memory controller 420 can be configured to perform memory access centering operations for each of the plurality of memories while the electronic noise is increased.

Figure 7:
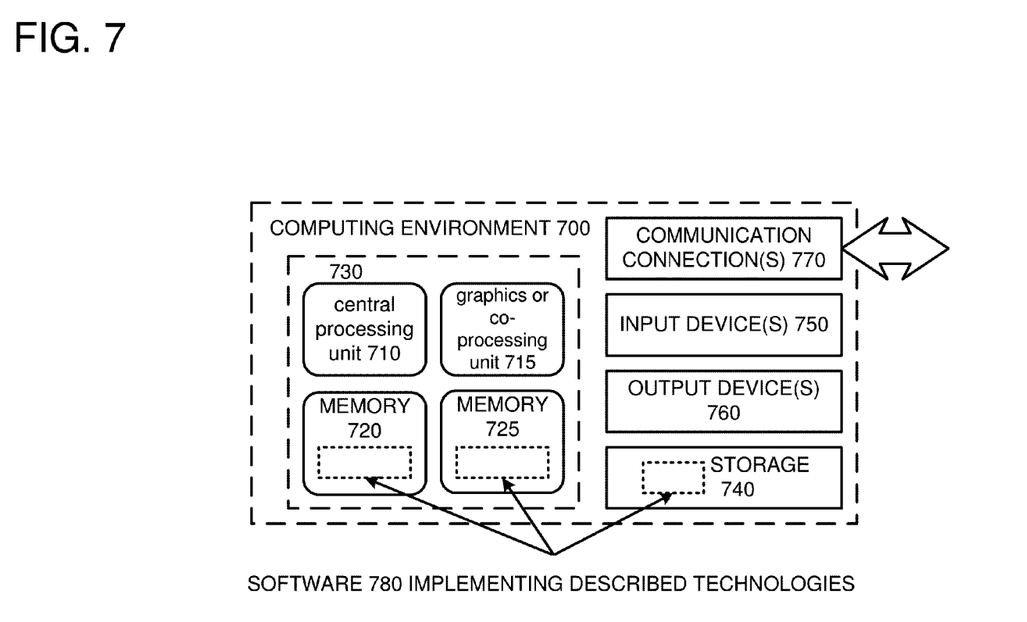
FIG. 7 is a diagram depicting a generalized example of a suitable computing environment in which the described innovations may be implemented.

FIG. 7 depicts a generalized example of a suitable computing environment 700 in which the described innovations may be implemented. The computing environment 700 is not intended to suggest any limitation as to scope of use or functionality, as the innovations may be implemented in diverse general-purpose or special-purpose computing systems. For example, the computing environment 700 can be any of a variety of computing devices (e.g., desktop computer, laptop computer, server computer, tablet computer, etc.).

With reference to FIG. 7, the computing environment 700 includes one or more processing units 710, 715 and memory 720, 725. In FIG. 7, this basic configuration 730 is included within a dashed line. The processing units 710, 715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 7 shows a central processing unit 710 as well as a graphics processing unit or co-processing unit 715. The tangible memory 720, 725 may be volatile memory (e.g., registers, cache, RAM), non-volatile memory (e.g., ROM, EEPROM, flash memory, etc.), or some combination of the two, accessible by the processing unit(s). The memory 720, 725 stores software 780 implementing one or more innovations described herein, (for example, in the form of computer-executable instructions suitable for execution by the processing unit(s)). In at least some embodiments, the memory 720, 725 can comprise one or more memory controllers, memories, and/or memory devices as described here.

A computing system may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing environment 700. The storage 740 stores instructions for the software 780 implementing one or more innovations described herein. In at least some embodiments, the tangible storage 740 can store all or part of one or more feature manifests (such as hardware feature manifests) and/or all or part of one or more source control repositories, as described herein.

The input device(s) 750 may be a touch input device such as a keyboard, mouse, pen, or trackball, a voice input device, a scanning device, or another device that provides input to the computing environment 700. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, assembly language, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-Specific Integrated Circuits (ASICs), Program-Specific Standard Products (ASSPs), System-On-a-Chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A system for computer memory training, the system comprising:
    a double data rate random-access memory (DDR RAM) attached to a circuit board;
    a memory controller;
    one or more ground lines between a ground of the memory controller and a ground of the circuit board; and
    a connection between the memory controller and a transistor attached to the circuit board,
    wherein the transistor is configured to activate or deactivate one or more of the ground lines responsive to a signal sent by the memory controller via the connection, and
    wherein the memory controller is configured to:
        receive a boot signal, the boot signal causing the memory controller to start a training phase of the DDR RAM;
        increase an electronic noise level of the DDR RAM during the training phase by transmitting a signal to the transistor, via the connection, to deactivate one or more of the ground lines;
        during the training phase of the DDR RAM, while the one or more ground lines are deactivated:
            identify a center of an access eye for the DDR RAM, wherein the access eye comprises a set of cells that are associated with a reference voltage (vref) and a delay,
            identify a center value associated with a point near to the center of the access eye, and
            perform, using the identified center value, a read centering operation for the DDR RAM; and
        during a subsequent operational phase of the DDR RAM, perform an access operation to the DDR RAM using the identified center value.

2. The system of claim 1, wherein increasing the electronic noise level of the DDR RAM comprises increasing an inductance of the DDR RAM.

3. The system of claim 1, wherein the transistor is a first transistor, the system further comprising:
    an inductor connected to one or more of the ground lines; and
    a second transistor attached to the circuit board, wherein the second transistor is configured to activate or deactivate the inductor responsive to a signal transmitted by the memory controller via the connection, and wherein the memory controller is further configured to increase the electronic noise level of the DDR RAM during the training phase by transmitting a signal to the second transistor, via the connection, to activate the inductor.

4. The system of claim 1, wherein the DDR RAM comprises a double data rate 4 memory.

5. The system of claim 3, further comprising an inverter connected to the first transistor, wherein the memory controller is also connected to the inverter via the connection, and wherein transmission of a signal from the memory controller to the second transistor via the connection to activate the inductor causes the inverter to send a signal to the first transistor that will deactivate the one or more ground lines.

6. The system of claim 3, wherein during the training phase, the memory controller is further configured to incrementally increase the electronic noise level of the DDR RAM, compare the resulting electronic noise level with an electronic noise level detected during a prior operational phase of the DDR RAM, and repeat this process until the electronic noise level is approximately equal to the electronic noise level detected during the operational phase of the memory.

7. The system of claim 6, wherein the memory controller incrementally increases the electronic noise level of the DDR RAM by deactivating the ground lines one by one.

8. The system of claim 6, wherein the inductor is one of a plurality of inductors connected to one or more of the ground lines, and wherein the memory controller incrementally increases the electronic noise level of the DDR RAM by activating the inductors one by one.

9. An integrated circuit comprising:
a memory controller, configured to:
detect an electronic noise level of a memory during an operational phase of the memory;
increase the electronic noise level of the memory during a subsequent training phase of the memory by deactivating one or more connections between a ground of the memory controller and a ground of a circuit board to which the memory is attached, one by one, until the electronic noise level is approximately equal to the electronic noise level detected during the operational phase of the memory;
during the training phase of the memory, while the one or more connections are deactivated:
identify a center of an access eye for the memory;
identify a center value associated with a point near to the center of the access eye; and
perform, using the identified center value, a memory access centering operation for the memory; and
during a subsequent operational phase of the memory, perform an access operation to the memory using the identified center value.

10. The integrated circuit of claim 9, wherein the increasing the electronic noise level of the memory during the training phase of the memory comprises increasing a ground bounce of the memory during the training phase of the memory.

11. The integrated circuit of claim 10, wherein increasing the ground bounce during the training phase of the memory comprises increasing an inductance during the training phase of the memory.

12. The integrated circuit of claim 9, wherein increasing the electronic noise level during the training phase of the memory further comprises the memory controller transmitting a signal to activate an inductor connected to one or more of the connections between the ground of the memory controller and the ground of the circuit board to which the memory is attached.

13. The integrated circuit of claim 9, wherein:
the memory access centering operation comprises a memory read centering operation; and
the memory controller is further configured to perform a memory write centering operation of the memory during the training phase of the memory while the one or more connections are deactivated.

14. The integrated circuit of claim 9, wherein the memory access centering operation is an access centering operation for a double data rate memory.

15. A computer-implemented method, the method comprising:
detecting an electronic noise level of a memory device during an operational phase of the memory device;
increasing the electronic noise level of the memory device during a subsequent training phase of the memory device by deactivating one or more connections between a ground of a memory controller and a ground of a circuit board to which the memory device is attached, one by one, until the electronic noise level of the memory device is approximately equal to the electronic noise level detected during the operational phase of the memory device;
during the training phase, while the one or more connections are deactivated:
identifying a center of an access eye for the memory device;
identifying a center value associated with a point near to the center of the access eye; and
performing, using the identified center value, a memory access centering operation for the memory device; and
during a subsequent operational phase of the memory device, performing an access operation to the memory device using the identified center value.

16. The computer-implemented method of claim 15, wherein the deactivation of the one or more connections increases an inductance of the memory device.

17. The computer-implemented method of claim 15, wherein increasing the electronic noise level of the memory device during the training phase further comprises the memory controller transmitting a signal to activate an inductor connected to one or more of the connections between the ground of the memory controller and the ground of the circuit board to which the memory device is attached.

18. The computer-implemented method of claim 15, wherein the memory device is a double data rate memory device.

19. The computer-implemented method of claim 15, wherein the memory access centering operation comprises a read access centering operation.

* * * * *